(12) United States Patent
Smayling et al.

(10) Patent No.: US 6,262,914 B1
(45) Date of Patent: Jul. 17, 2001

(54) FLASH MEMORY SEGMENTATION

(75) Inventors: Michael C. Smayling, Sunnyvale, CA (US); Giulio G. Marotta, Contigliano; Giovanni Santin, Santa Rufina, both of (IT)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/372,266

(22) Filed: Aug. 11, 1999

(51) Int. Cl.[7] .................................................. G11C 16/04
(52) U.S. Cl. .............................. 365/185.11; 365/185.01; 365/185.05; 365/185.12; 365/185.13; 365/185.17
(58) Field of Search ...................... 365/185.01, 185.11, 365/185.05, 185.12, 185.13, 185.17

(56) References Cited

U.S. PATENT DOCUMENTS

| | | | |
|---|---|---|---|
| 5,646,886 | 7/1997 | Brahmbhatt . | |
| 5,659,505 | * 8/1997 | Kobayashi et al. | 365/185.29 |
| 5,713,636 | * 2/1998 | Dallabora et al. | 365/185.13 |
| 5,745,410 | * 4/1998 | Yiu et al. | 365/185.3 |
| 5,748,528 | * 5/1998 | Campardo et al. | 365/185.13 |
| 5,748,535 | * 5/1998 | Lin et al. | 365/185.22 |
| 5,896,340 | * 4/1999 | Wong et al. | 365/230.03 |

* cited by examiner

*Primary Examiner*—Viet Q. Nguyen
(74) *Attorney, Agent, or Firm*—William B. Kempler; Frederick J. Telecky, Jr.

(57) ABSTRACT

Segmentation of FLASH Memory arrays allows the global and local bit lines to be isolated, greatly reducing global bit line capacitance, reducing bit line stress, and eliminating boot block disturb effects. Reduction in bit line capacitance also results in fast access time greatly improving the ability to implement larger arrays without paying severe access time penalties.

9 Claims, 6 Drawing Sheets

| FUNCTION | SELECTED WORD LINE | DESELECTED WORD LINE | SELECTED BIT LINE | DESELECTED BIT LINE | BACK GATE (ISOLATED P-WELL) | SELECTED SOURCE LINE SELECTED SEGMENT LINE | VIRTUAL GROUND |
|---|---|---|---|---|---|---|---|
| PROGRAM (WRITE '0') (BYTE-BY-BYTE) | ~10-12 VOLTS | ~0 VOLTS | 6-7 VOLTS | FLOAT | ~0 VOLTS | ~0 VOLTS | ~0 VOLTS |
| BIT LINE STRESS | ~0 VOLTS | N/A | 6-7 VOLTS | N/A | ~0 VOLTS | N/A | ~0 VOLTS |
| SECTOR OF BLOCK ERASE (WRITE '1') | ~0 VOLTS | ~15 VOLTS | FLOAT | FLOAT | ~15 VOLTS | FLOAT | FLOAT |
| READ (NORMAL VERIFICATION) | 5 VOLTS | ~0 VOLTS | 1.2 VOLTS | FLOAT | ~0 VOLTS | ~0 VOLTS | ~0 VOLTS |
| FLASH WRITE | ~12 VOLTS | N/A | ~0 VOLTS | N/A | ~0 VOLTS | ~0 VOLTS | ~0 VOLTS |

FIG. 8

FLASH MEMORY SEGMENTATION

TECHNICAL FIELD OF THE INVENTION

The technical field of this invention is FLASH memory an particularly programming and clearing FLASH memory.

BACKGROUND OF THE INVENTION

Semiconductor memories of several types have become key support hardware for today's computer systems. While DRAM (dynamic random access memory) has been used mainly in the form of dedicated chips, most of the other types have been employed both as dedicated chips and as embedded memory, located on the main central processing unit chip.

These other types include: (1) SRAM (static random access memory), (2) ROM (read-only memory), (3) EPROM (electrically programmable read-only memory), (4) EEPROM (eraseable electrically programmable read-only memory), and (5) FLASH (an acronym meaning simply "high speed eraseable, electrically programmable read-only memory"). The last three, EPROM, EEPROM, and FLASH use basically similar device technology process steps and device structure at the heart of the memory element. The key device is a dual-gate NMOS transistor. A first gate, called the control gate, is normally connected to the circuit node which electrically drives it. A second gate is floating electrically and is used to hold a charge. This charge can be altered electrically by applying a combination of specific values of impressed voltages on the normal gate and source/drain terminals. The charge present on the floating gate determines whether a logical "0" or a logical "1" is stored at the cell location of the floating gate transistor.

This floating gate structure is a compact device. The precision process from which it is formed provides a transistor well controlled in its characteristics. There are three basic differences of the FLASH structure over the EPROM structure. In the FLASH structure the geometric details around the periphery and within the active area of the gates have been modified to make the device more amenable to programming in-sitsu, that is programming while the device is located in its application socket. The gate oxide thickness has been reduced in the FLASH memory element transistor. This allows for charge tunnelling to occur and makes possible channel erasing. In channel erasing the central active area of the channel participates in the erasing rather than only at the active gate periphery. The FLASH device also includes additional required biasing circuitry to allow erasing.

In order of historical sequence, the PROM was first used for read-only memory applications and the devices were programmed by a masking operation. In order to satisfy the need for custom programming with short turn-around time at the user's location, the EPROM was developed next. Such EPROMs can be erased only by UV light, thus the and packages have to be transparent. This, by its nature, ruled out embedded processor usage, as the embedded processors can not be encased in such packages.

The EEPROM was developed next and it allowed electrical erasing without UV light. The EEPROM required an extra transistor for select in each cell and this made the chip area per cell too costly. The FLASH memory cell surmounts all the objections, giving excellent performance and excellent cell density. The conventional FLASH memory remains the solution of choice in read-only memory applications. The FLASH memory also has seen needed incremental technology improvements, leading to better producibility, reliability, and performance. Ease of programming is also an area undergoing continued investigation and experimentation. Texas Instruments FLASH memory devices differ in two important respects from other FLASH memory devices being produced.

First, some prior art FLASH memories use N-epitaxial structures or even simple P-substrate structures, which do not allow for selective bias to the back-gate of a cell. FIG. 1 shows such an N-epitaxial structure. Selective bias cannot be applied to the N-epitaxial back-gate which is common to all devices. FIG. 2 shows the Texas Instruments prior art device structure, a P-substrate epitaxial structure having an N-well back gate. This back gate has several advantages leading to the possibility of generating isolated components for effective circuit use, but most notably, enables a simple "block or sector" pre-programming step which erases either blocks or sectors of the whole array at once. Blocks and sectors are illustrated in FIG. 3. FIG. 3 illustrates three common organizations for FLASH memories. In the block configuration all locations are erased at once in a block erase operation. In the boot-block configuration, addressing may be directed to the programming sector or the boot block sector. Therefore, this configuration is suited to sector erase. In the fully sectored configuration, the erasing is carried out individually in multiple sectors. Conventional FLASH memories are committed to more complex erasing on a byte-by-byte basis. Secondly, Texas Instruments arrays use a switched "source select" line, operating to apply a virtual ground only to those bits being programmed or READ.

A typical prior art FLASH memory circuit configuration is shown in FIG. 4. The memory cell consists of (a) the floating gate N-Channel transistor 401 and (b) associated bit line 402 drive, word line 403, drive and virtual ground 404, and switch circuitry 406. FIG. 5 illustrates an array of such memory cells. These are normally arranged in groups of either 16 or 32 columns. These groups have a common sense amplifier such as 533, and either 8 or 16 sense amplifiers 533, 537, 538 and 539 form one eight-bit byte or one sixteen-bit word of output data.

During in programming or erasing sense amplifier 533 is used to verify that the correct logical state is stored at the desired location. In application usage for reading, sense amplifier 533 is used to detect the desired data and provide interface from the limited drive strength of the memory cell to a CMOS (or TTL) output buffer to the chip terminals or the embedded function's internal terminals. FIG. 6 shows eight bits in detail, four least significant bits (LSB) and four significant bits (MSB) of a sixteen or thirty-two bit column group. Two words are shown, word 0 and word N.

The floating gate N-Channel transistor (401 of FIG. 4) has the characteristics illustrated in FIG. 7. When this transistor has a zero charge on its floating gate, the transistor has the I-V (current-voltage) characteristic of curve "A". With a negative charge "$Q^-$" on the floating gate, the I-V characteristic shifts to curve "B". With a positive charge "$Q^+$" on the floating gate, the I-V characteristic shifts to curve "C".

Programming consists of addressing a particular word line 403 and a particular bit line 402. An appropriate voltage higher than the normal operational voltage is impressed on that word line. Simultaneously, the addressed bit line 402 is driven with the voltage required to charge the floating gate to value $Q^-$ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Programming and erasing are normally carried out by applying pulses to the word line or the bit line requiring the higher voltage. The appropriate voltages are illustrated in the table of FIG. 8. By convention, the term "programming" is synonymous with writing "0" and "erasing" is synonymous with writing "1".

The "READ (normal verification)" operation shown in FIG. 8 verifies that programming has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of $10^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

SUMMARY OF THE INVENTION

This invention relates to a unique organization of FLASH memory elements into segmented arrays. These segmented arrays are implemented on an P-epitaxial CMOS process having capability for both single gate and dual gate MOS devices, and utilizes the back gate biasing feature to provide more straightforward pre-programming erase of all bit locations at once. Segmentation is implemented with both a "source select" and a "segment select" switch transistor fully isolating segments for increased immunity to bit-line stress and disturbance of deselected bits. The preferred process is multilevel metal of at least: three layers, providing ease of layout routing and significant reduction of capacitance in the crucial areas. When this fabrication process, device structure and circuit isolation techniques are used the capacitive load on the switched bit-lines is greatly reduced by isolating the capacitance of the unswitched sub-bit lines from the switched global bit lines.

The preferred embodiment of this invention has several notable advantages. The invention results in improved memory access time performance as a result the lower global bit line capacitance in the segmented array. This is a result of segmentation itself and the routing of global bit lines on the highest metal level as well. The segmented array of this invention has lower bit line stress by virtue of the non-switched sectors being isolated from the local bit lines. The boot block disturbance is eliminated in this invention by isolating the sectors. The chip area is reduced in this invention by eliminating the need for replication of column decoders and sense amplifiers and by routing crucial bit lines on the highest metal level of the multiple metal levels of the device.

BRIEF DESCRIPTION OF THE DRAWINGS

These and other aspects of this invention are illustrated in the drawings, in which:

FIG. 8 gives a table of applied voltage conditions at the bit line, word line, and back-gate terminals and virtual ground state for program, erase and read according to the prior art and the conditions applied for testing for bit line stress testing according to the prior art, FLASH write "1" according to the prior art and sector or block clearing according to this invention;

DETAILED DESCRIPTION OF PREFERRED EMBODIMENTS

Figure 4:
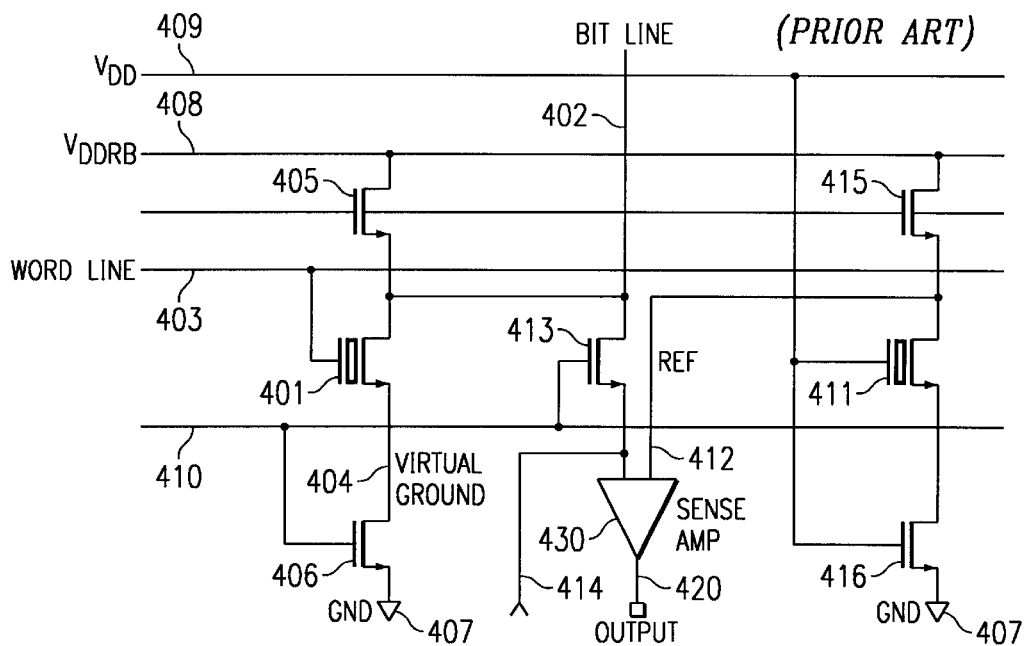
FIG. 4 illustrates a typical FLASH memory circuit configuration of the prior art.

Referring to the circuit configuration of FIG. 4, transistor 401 is the dual gate N-Channel device which is the memory element for a single bit. The bit line for writing data is line 402 and the word select line is line 403. The virtual ground node 404 is switched "on" for write "0" and for read operations and is allowed to float for write "1" and READ operations.

Figure 5:
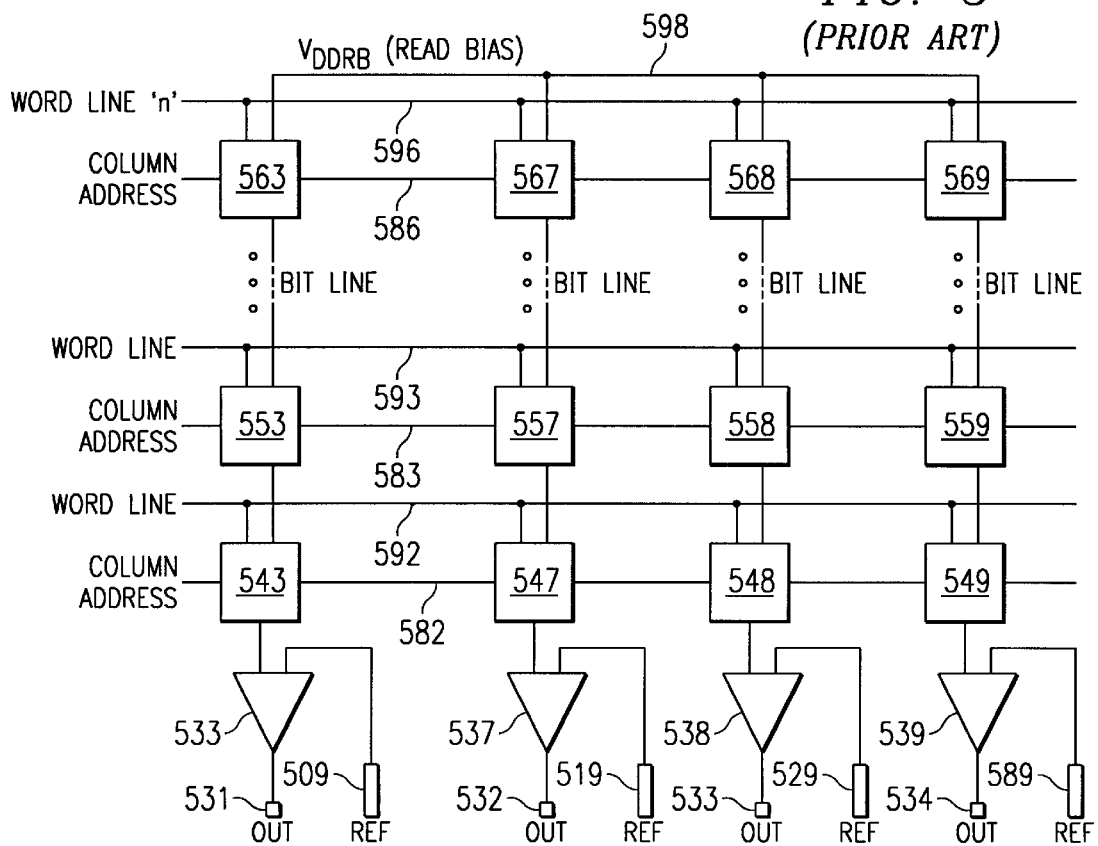
FIG. 5 illustrates the essentials of a prior art array of FLASH memory cells.

FIG. 5 shows a typical array of FLASH memory cells. Sense amplifier 533 is one of typically eight (or sixteen) such sense amplifiers in the array. The blocks 543, 553, 563; 547, 557, 567; 548, 558, 568; and 549, 559, 569 each contain column decoders and sixteen or thirty-two columns of memory elements such as illustrated in FIG. 4.

Figure 6:
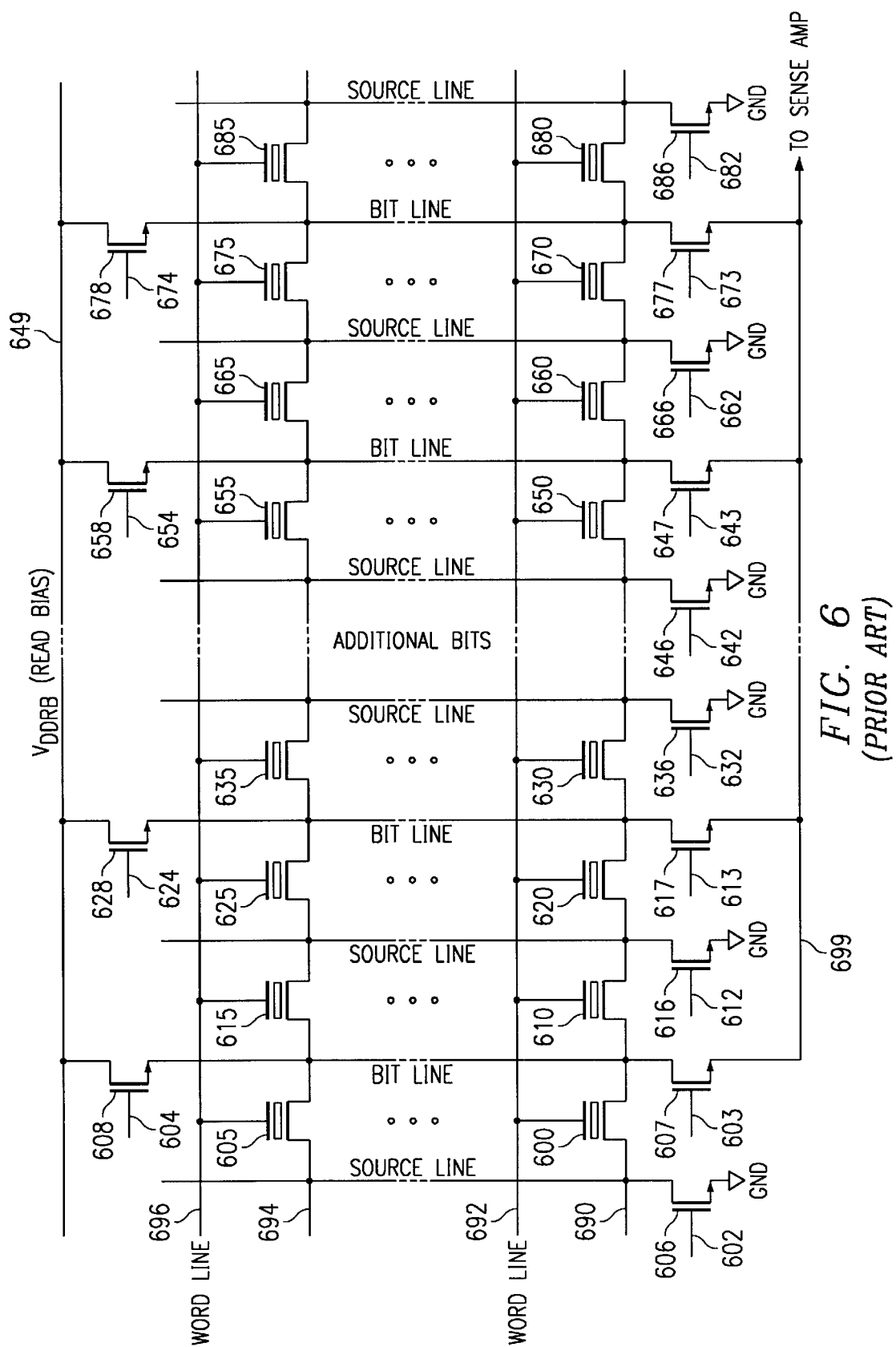
FIG. 6 illustrates the details of transistors and interconnection at the heart of the prior art memory cells.

FIG. 6 shows eight bits in detail, four least significant bits (LSB) and four most significant bits (MSB) of the sixteen or thirty-two bit column group. Two words are shown, word 0 and word N. Transistors 607, 617, 647, and 677 are output transistors driven by the column decoders which electrically connect one of sixteen (or thirty-two) bit lines to the signal input to a corresponding sense amplifier. Source select transistors 606, 616, 636, 646, 666, 686 are driven from column decoders also, and select the "left side bit" (stored in transistor 600, for example) or the "right-side bit" (stored in transistor 610).

Eight (or sixteen) sense amplifiers illustrated by 533, 537, 538, 539 of FIG. 5 collectively form an eight-bit byte (or a sixteen-bit word) portion of the long memory word stored in the FLASH memory. As an example, with thirty-two column groups multiplexed into each sense amplifier, and an array having sixteen sense amplifiers, the word length is 512 bits.

Figure 7:
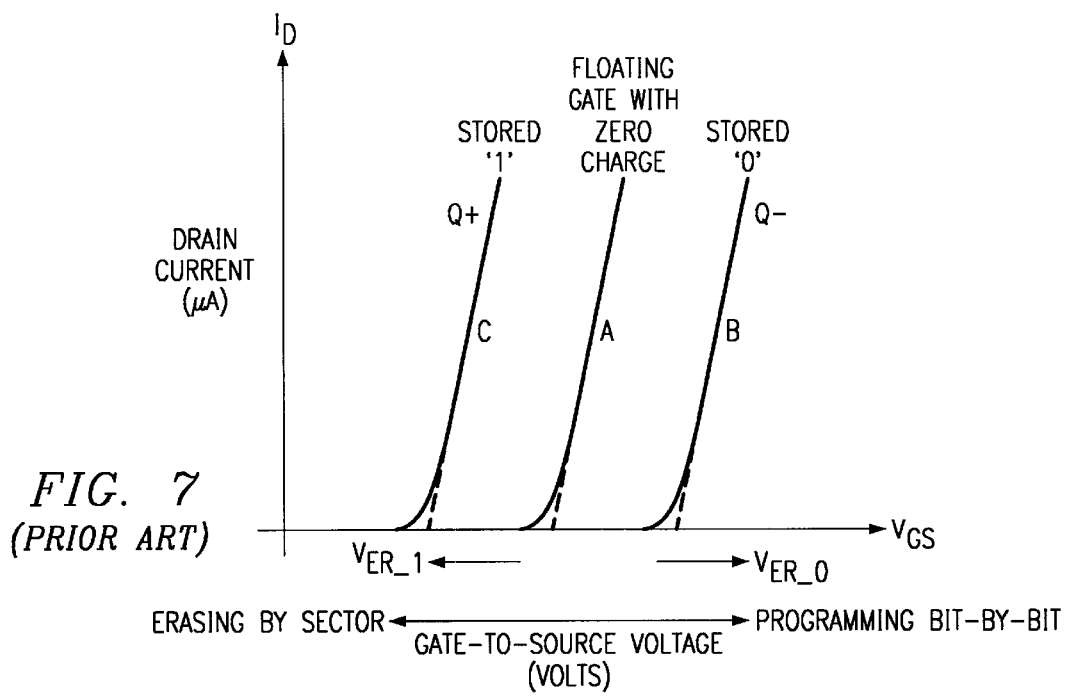
FIG. 7 describes the current-voltage (I-V) characteristics of a floating gate transistor of the prior art with the charge on floating gate as a parameter.

The floating gate N-Channel transistor (401 of FIG. 4) has the characteristics illustrated in FIG. 7. When this transistor has a zero charge on its floating gate, the transistor has the I-V (current-voltage) characteristic of curve "A". With a negative charge "Q$^-$" on the floating gate, the I-V characteristic shifts to curve "B". With a positive charge "Q$^+$" on the floating gate, the I-V characteristic shifts to curve "C".

Programming consists of addressing a particular word line and a particular bit line. AN appropriate voltage higher than the normal operational voltage is impressed on that word line. Simultaneously, the addressed bit line is driven with the voltage required to charge the floating gate to value Q$^-$ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Programming and erasing are normally carried out by applying pulses to the word Line or the bit line requiring the higher voltage. The appropriate voltages are illustrated in the table of FIG. 8. By convention, the term "programming" is synonymous with writing "0" and "erasing" is synonymous with writing "1".

The "READ (normal verification) operation shown in FIG. 8 verifies that programming has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of 10$^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

Figure 9:
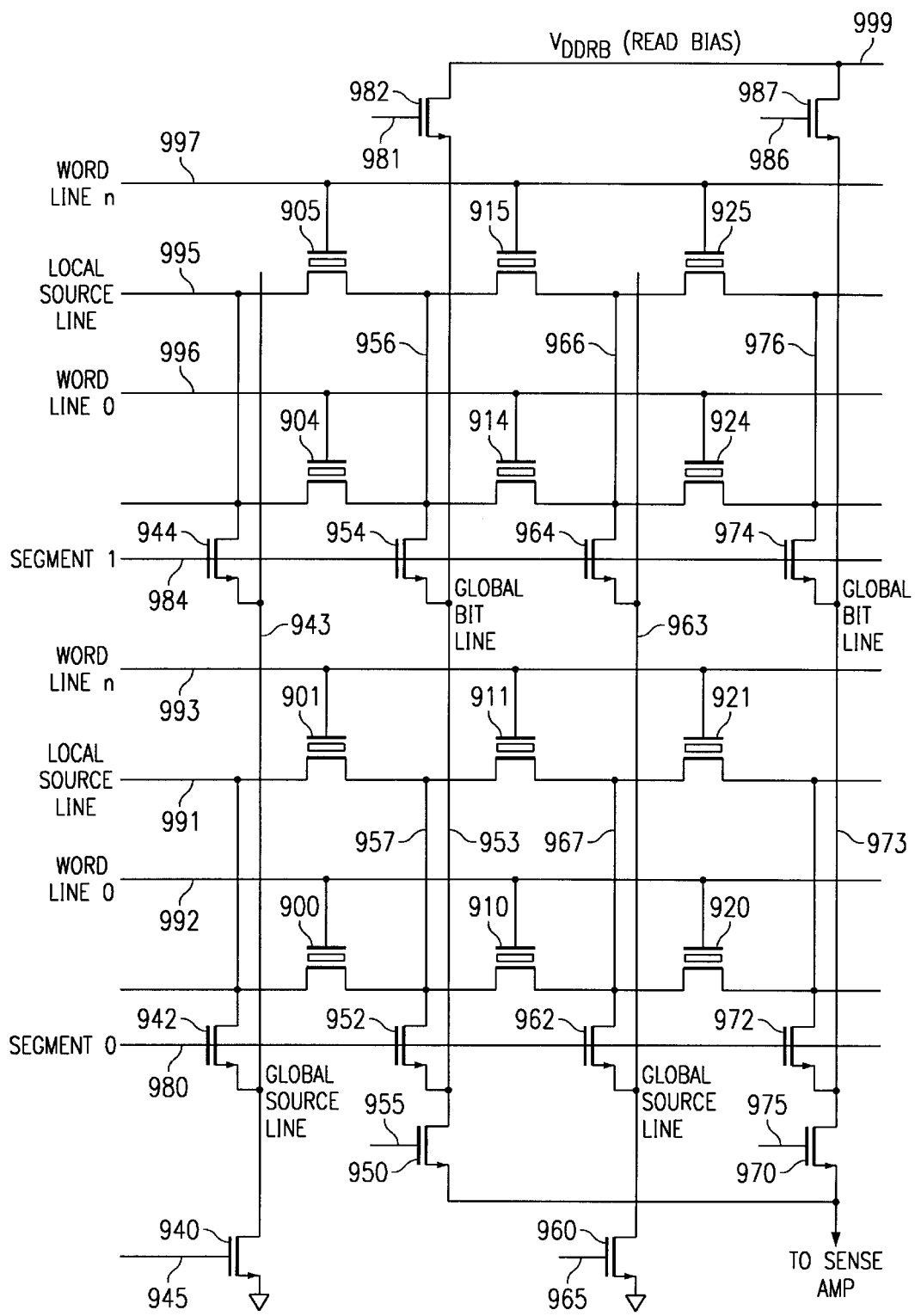
FIG. 9 illustrates the segmented FLASH memory array architecture of the preferred embodiment of the present invention, showing the arrangement of segments and their coupling through the sector switch transistors.

FIG. 9 illustrates the principle of segmentation in the FLASH memory array. Each word is broken into a number of segments, a global segment (segment 0) and local segments (segments 1 through N). For ease of illustration, FIG. 9 shows only two words per segment. There could be many more. Sixty-four words is representative of a normal configuration. Segment switch transistors 954 and 974 can be viewed as electronically connecting respective global bit line nodes 953 and 973 to corresponding local bit line nodes 956 and 976. Only one such segment is connected at a given time.

Similarly, the global and local source lines are also segmented and isolated from one another. Source switch transistors 942 and 962 can be viewed as electronically connecting respective global source line nodes 943 and 963 to corresponding local source Line nodes 991 and 967. Only one segment is connected at a given time. Segment decoding is derived from what is normally the pre-decoding of the row address bits in non-segmented arrays.

Figure 10:
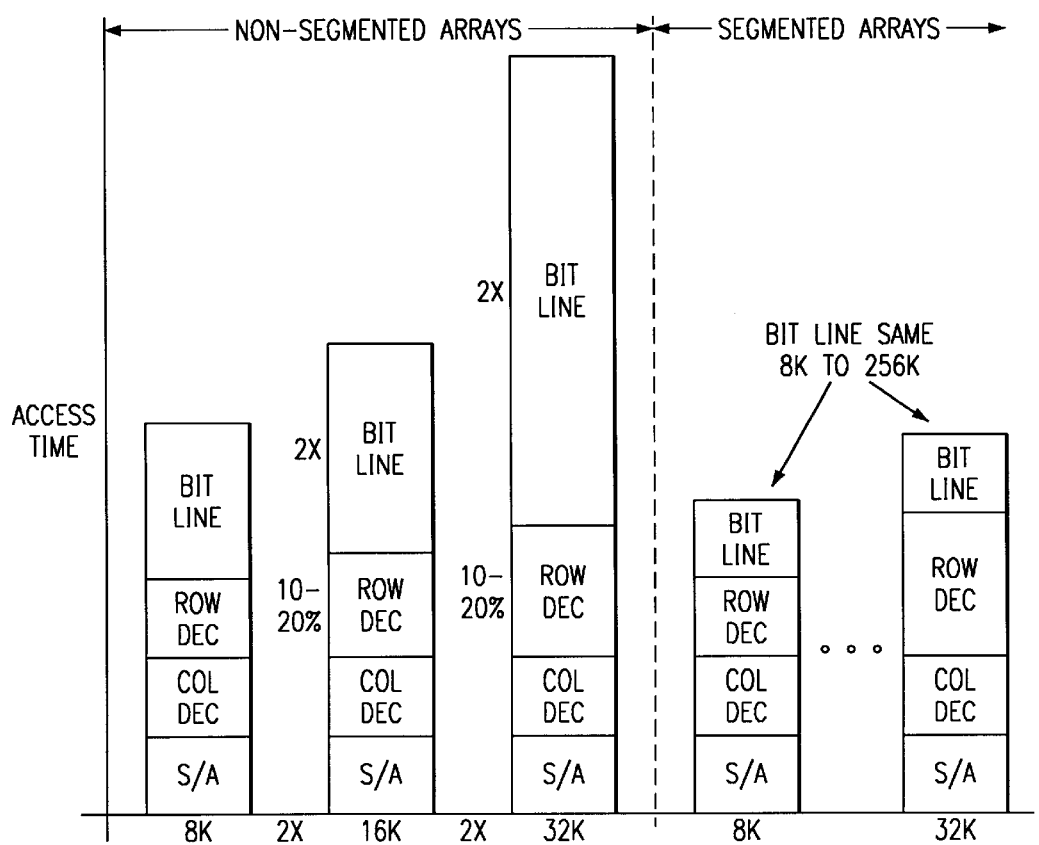
FIG. 10 illustrates the typical components of access time as conventional memory arrays increase in size and the effect of segmentation as described in the preferred embodiment of this invention in reducing access time.

When compared to a conventional array having the same number of words, each containing the same number of bits, the segmented array can provide an enormous reduction in bit-line capacitance. Bit-line capacitance is a major contributor to access time performance. FIG. 10 shows the typical components for access time for several sizes of large FLASH memory arrays. The sense amplifier delay (S/A) is independent of the array size. The column decode delay (COL DEC) is independent of the array size. The row decode delay (ROW DEC) increases moderately with array size. This row decode delay increases approximately 10 to 20% for each doubling of the array size. The bit-line capacitance delay (BIT LINE) scales upward as non-segmented array size increases, but is independent of array size for segmented arrays. Because capacitance on the bit line is the most important factor limiting access time performance, a reduction of over 50% in the access time (for a 64K module) may be realized using the segment array of the preferred embodiment of this invention rather than the prior art. This speed improvement is obtained at the slight extra cost of the added complexity of the segment switch transistors. This addition of segment switch transistors may be more than compensated for by the use of an additional metal level (level 3). This greatly reduces the routing capacitance of the bit lines and allows for increased layout density. Local bit lines are routed on the lowest metal level (level 1) and word lines are routed on the intermediate level (level 2).

Bit line stress, which is a severe problem in conventional FLASH memory arrays, is eliminated through the use of segmentation of the preferred embodiment of the invention. This bit line stress effect may be understood with reference to FIG. 5. Bit lines in this conventional array have significant capacitive loading which increases directly with the number of words in the array. As arrays are in the process of being programmed, indeed, even in ordinary read/write cycling, switching this capacitive load can cause disturbances in unaddressed bits via bit line stress.

Driving these lines during programming, erase and clear cycles can produce interactions between the selected and non-selected words, and disturb stored and verified data. For this reason, testing of FLASH arrays normally includes a bit-stress test operation detailed in relation to FIG. 4. This is virtually a write "0" operation in which selected words are examined for the occurrence of this problem. The segmented arrays of this invention are free from this effect by virtue of the segment select and source select switch transistors which isolate each segment from all the others.

The "boot block disturb" problem is also well known to suppliers of conventional FLASH memory modules. Most FLASH memory arrays can conceptually be divided into a boot block data, which stores the "boot-the-module" program data, and other program data, which stores data handling all other program operations. Users normally have no need to re-program the "boot block data", but have frequent need to re-program some portion of the "other program data" of the array, usually all of the "other program data".

In this re-program operation the stored boot block data is subjected in to enormous interactions (many programming cycles using high voltage, high frequency pulses) and the pre-disposition to disturb the boot block data is severe. This is accentuated in arrays having many words and a high level of coupling between the same bit position of different words. The segmentation of the present embodiment of this invention eliminates this coupling and hence eliminates the boot block disturb problem.

Figure 1:
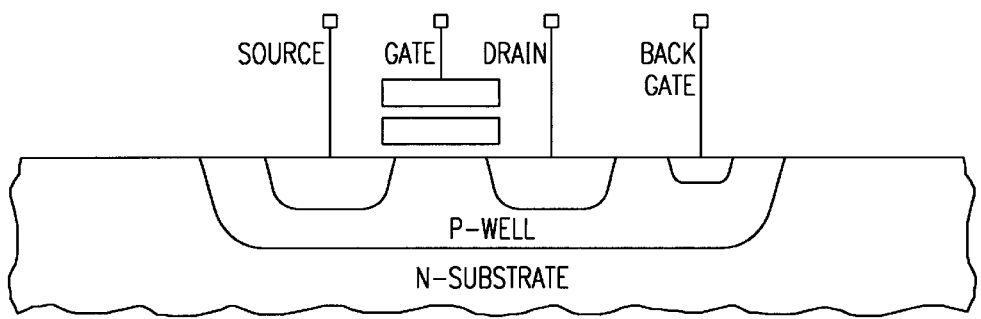
FIG. 1 illustrates the structure of a prior art N-epitaxial FLASH memory process structure.
Figure 2:
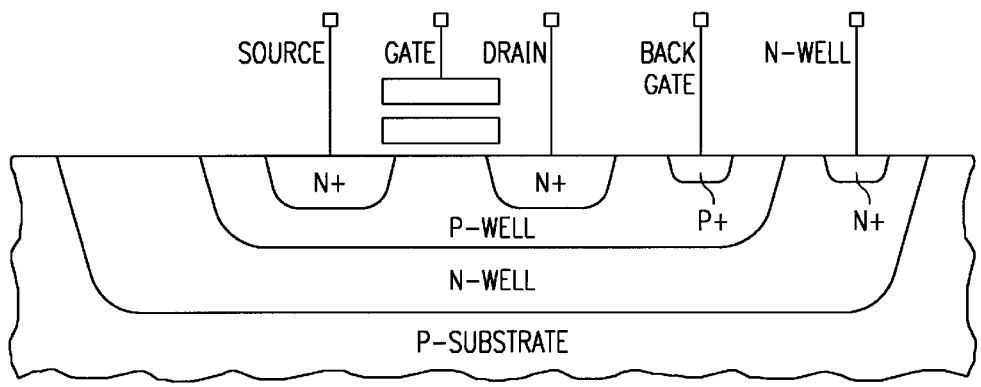
FIG. 2 illustrates the prior art structure of the Texas Instruments P-epitaxial substrate process in comparison to other FLASH memory process structures.
Figure 3:
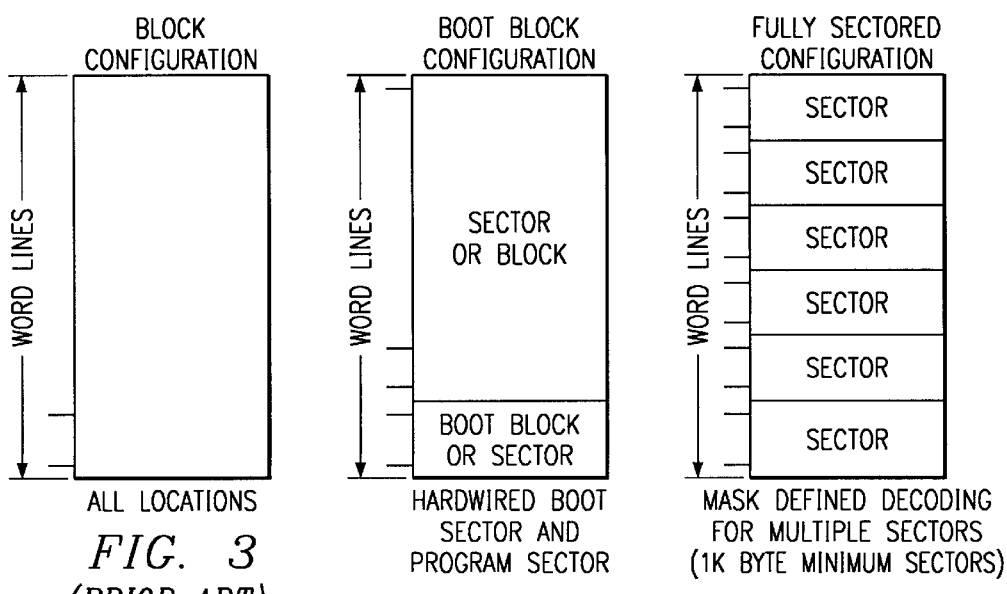
FIG. 3 illustrates the prior art concept of block, boot block and fully sectored FLASH memory configurations.

FLASH memory arrays produced by Texas Instruments have a number of distinguishing characteristics when compared to those of other suppliers. A first major difference concerns the back gate well in the Texas Instruments device structure illustrated in FIG. 2. This back gate permits isolating components for effective circuit use. This back gate also permits a simple channel erase pre-programming step which erases the whole array at once. Conventional FLASH memories are committed to more complex erasing on a bit-by-bit basis.

Additionally, Texas Instruments arrays use a switched "source select" line, operating to apply a virtual ground only to those bits being programmed or READ. Using segmentation in all types of FLASH arrays, Texas Instruments arrays or other suppliers' more conventional arrays, does still raise important subtle issues which do not concern non-segmented arrays. Chiefly among these is the consideration of the state of a bit of stored data at the local sub-bit lines wherein a bit may not be addressed for a large number of cycles, and then be addressed.

The unaddressed sub bit lines (e.g. 956 in FIG. 9) have a tendency to discharge toward zero volts, and have a only a fixed amount of time to cycle into the logical "0" or logical "1" state voltage values which must be sensed when they are freshly addressed. There are several ways to assure that these unaddressed sub-bit lines are pre-conditioned (recharged) on each cycle to avoid the discharge to zero volts on unaddressed cycles. One involves the generation of a re-charge pulse initiated by the address transition detector. Another is to subject all bits to a re-charge pulse generated every cycle during the time the device is not being read, but addresses are changing and becoming valid. These notable device concerns are conspicuously absent in most, if not all prior art patents.

Although the preferred embodiment has been described in detail, it should be understood that various changes, substitutions and alterations can be made therein without departing from the spirit and scope of the invention as defined by the appended claims.

What is claimed is:

1. A FLASH memory system comprising:
an array of memory cells arranged in segments, each segment comprising:
a plurality of local source lines;
a plurality of local sub-bit lines arranged so that one local sub-bit line is formed between each adjacent pair of local source lines;
a plurality of word lines for each of the N words per segment;
a plurality of FLASH memory cells connected in an array of local rows and local columns, each memory cell having a first terminal and a second terminal;
each local row connected at the drain of each memory cell to the drain of a segment switch transistor whose control gate is driven by the segment local bit line select signal, and whose source is connected to the global bit line;
each local row connected at the source of each memory cell to the drain of a segment switch transistor whose control gate is driven by the segment local source line select signal, and whose source is connected to the local virtual ground;
a plurality of global source lines;
a plurality of virtual ground switch N-channel transistors, 945, 965 each having a first source-drain terminal coupled to said first terminal of a corresponding memory cell, a second source-drain terminal coupled to ground and a control gate receiving a corresponding segment select signal;
a plurality of global bit lines;
a plurality of bit select N-channel transistors, each having a first source-drain terminal coupled to said second terminal of a corresponding memory cell, a second source-drain terminal connected to a corresponding global bit line and a control gate receiving said corresponding segment select signal wherein:
said FLASH memory array being arranged on a three level metal process, wherein:
said global bit lines and said global source lines are placed on metal level three at the top level of the metal-oxide-semiconductor sandwich furthest from said array of memory cells,
said word lines are placed on metal level two at intermediate level of the metal-oxide-semiconductor sandwich, and
said local sub-bit lines are placed on metal level one at the bottom level of the metal-oxide-semiconductor sandwich closest to said array of memory cells.

2. The FLASH memory system of claim 1, wherein:
each local row comprises a plurality of memory cells, each cell connected at its control gate terminal to a corresponding one of said plurality of word lines.

3. The FLASH memory system of claim 2, wherein:
said plurality of memory cells in each row consists of 8 memory cells.

4. The FLASH memory system of claim 2, wherein:
said plurality of memory cells in each row consists of 16 memory cells.

5. The FLASH memory system of claim 1, wherein:
each local column comprises a plurality of FLASH memory cells having a first source-drain terminal connected to a corresponding local sub-bit line and having a second source-drain terminal connected to a corresponding local source line.

6. The FLASH memory system of claim 1, wherein:
each of said memory cells consists of a dual gate N-Channel transistor having a first drain-source terminal connected to a corresponding local sub-bit line, a second drain-source terminal connected to a corresponding local source line, a control gate connected to a corresponding word line and a floating gate storing an electronic charge, said electronic charge having one of multiple value distributions, each value distribution determining a stored binary logic state.

7. The FLASH memory system of claim 1, further comprising:
a program voltage source producing a high voltage applied to a selected word line and a moderately high voltage applied to a selected bit line, whereby a logical "0" is written into a corresponding addressed memory cell.

8. The FLASH memory system of claim 1, further comprising:
   an erase circuit producing zero volts applied to a selected word line and a moderately high voltage applied to all bit lines, thereby resulting in a channel oriented erase.

9. The FLASH memory system of claim 1, further comprising:
   a read means by which a selected cell may be read by applying a normal supply voltage value to a selected word line and a reference signal voltage having a value intermediate between the logical "1" and the logical "0" specification for the device.

* * * * *